United States Patent [19]

Nakamura et al.

[11] 4,416,216

[45] Nov. 22, 1983

[54] APPARATUS FOR FORMING AN INHOMOGENEOUS OPTICAL LAYER

[75] Inventors: Kazuo Nakamura, Tokyo; Hirotsugu Mizorogi, Ebina; Akihiko Isao, Sakura, all of Japan

[73] Assignees: Ulvac Seimaku Kabushiki Kaisha; Nihon Shinku Gijutsu Kabushihki Kaisha, both of Japan

[21] Appl. No.: 373,144

[22] Filed: Apr. 29, 1982

[30] Foreign Application Priority Data

Jul. 31, 1981 [JP]  Japan ............................. 56-119149

[51] Int. Cl.³ .......................... B05D 1/34; B05D 5/06
[52] U.S. Cl. .................................. 118/696; 118/719; 118/720; 118/729
[58] Field of Search ................ 118/696, 719, 720, 729

[56]  References Cited
U.S. PATENT DOCUMENTS 3,520,716  7/1970  Okamoto et al. ............... 118/720 X

*Primary Examiner*—James R. Hoffman
*Attorney, Agent, or Firm*—Mason, Fenwick & Lawrence

[57]  ABSTRACT

An inhomogeneous optical layer is formed on a surface of a substrate in a vacuum coater, in which the substrate is moved along a travelling path having path sections and a substance is evaporated from its source and deposited on the surface while the deposited substance is exposed to gas which is able to react on the substance. In such an operation, the deposition rate of the substance is varied monotonously along the path in each of the path section in order that, in a layer formed by the deposition on the substrate, the content of the substance and that of the reaction product are varied monotonously in the direction of thickness. If the refractive index of the substance is different from that of the reaction product, the resultant refractive index in the layer is varied monotonously in the direction of the thickness of the layer.

4 Claims, 17 Drawing Figures

F I G. 12
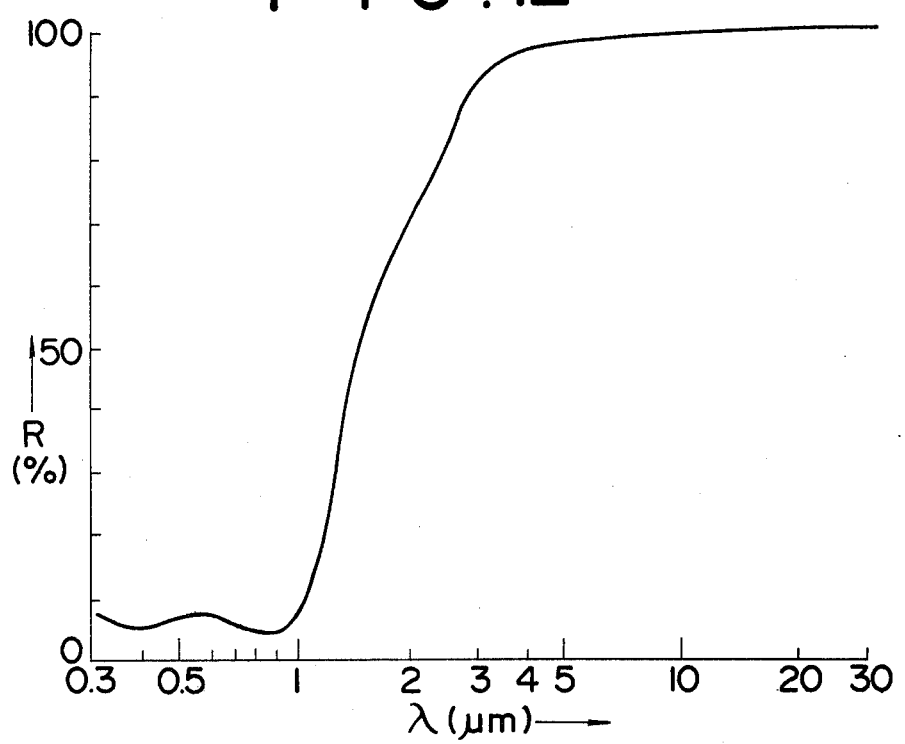
F I G. 13
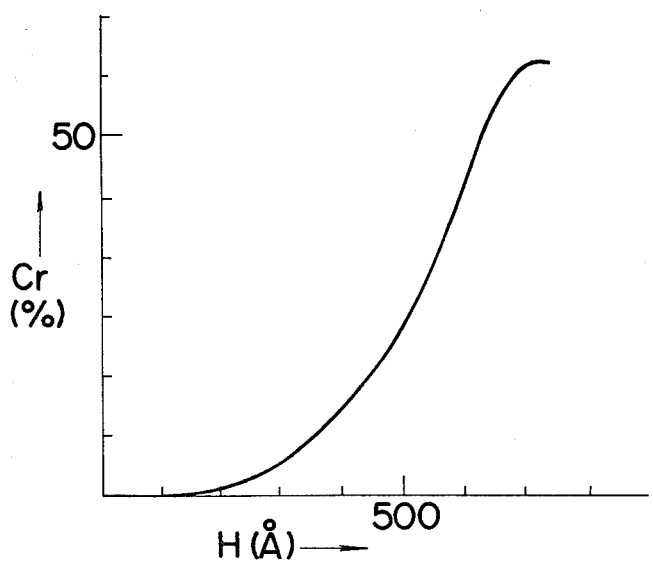

APPARATUS FOR FORMING AN INHOMOGENEOUS OPTICAL LAYER

TECHNICAL FIELD

The present invention relates to a method and an apparatus for forming an inhomogeneous optical layer on a surface of a substrate.

BACKGROUND OF THE INVENTION

The inhomogeneous optical layer is a layer which is so formed that the optical refractive index varies from its inner surface contacting with the substrate to its outer surface or exposed surface, and a special inhomogenous optical layer in which the refractive index varies monotonously is used widely as an optical film for preventing reflection of light or as an optical film for absorbing light selectively depending on the wave length of the light.

In a known method for forming such an inhomogeneous optical layer, the substrate is fixed in a vacuum coater vessel including two evaporation sources so that a surface of this substrate faces one evaporation source for high refractive substance as well as the other evaporation source for low refractive substance, and both the sources are energized in order that both the substances are evaporated in the sources, emitted from them and deposited on said one surface. Each of the deposition rate of each of the substances is watched by an appropriate monitor, and the input energy of each of the sources is controlled in order to vary the deposition rate of each of the substances with time according to the program. For example: if the depositing rate of the high refractive substance is decreased monotonously with time and that of the low refractive substance is increased monotonously with time; in the layer made of both the substances deposited on said one surface, the content of the high refractive substance decreases monotonously in the direction of the outer surface of the layer and the content of the low refractive substance increases monotonously in the same direction, and therefore the resultant refractive index in the layer decreases in said direction.

However, the known method has disadvantage that it is impossible to form an inhomogeneous optical layer on a surface of a long, wide or large substance because the substrate has to be fixed in the vacuum vessel, and the operation is troublesome because it is necessary to vary the deposition rate with time.

SUMMARY OF THE INVENTION

Accordingly, an object of the invention is to provide a method and an apparatus for forming an inhomogeneous optical layer in which the layer may be formed on a long, wide or large substrate without varying the deposition rate with time.

In order to achieve said object, the invention provides a method for forming an unhomogeneous optical layer on a surface of a substrate, in which, while the substrate is moved along a travelling path having a path section or a number of path sections, an evaporation substance evaporated from its source means is deposited on said surface with the deposition rate being varied monotonously along the travelling path in the path section or each of the path sections, and the deposited evaporation substance is exposed to reaction gas which is able to react on the evaporation substance.

In this method it is advisable that the incident angle and the flight length of the evaporation substance are varied monotonously along the travelling path in the path section or each of the path sections in order that the deposition rate is varied monotonously along the travelling path in the path section or each of the path sections.

It is also advisable that the incident density of the reaction gas flow is varied monotonously along the travelling path in the path section or each of the path sections.

The invention provides, moreover, an apparatus for forming an inhomogeneous optical layer on a surface of a substrate comprising a vacuum vessel, means for moving the substrate along a travelling path in the vacuum vessel, said travelling path having a path section or a number of path sections, source means for evaporating an evaporation substance in the vacuum vessel, deposition rate regulating means for causing the evaporation substance evaporated from the source means to be deposited on the surface of the substrate moving along the travelling path with the deposition rate being varied monotonously along the travelling path in the path section or each of the path sections, and exposure means for causing the deposited evaporation substance to be exposed to reaction gas which is able to react on the evaporation substance.

It is preferable that the deposition rate regulating means is constructed by shader means which shades the evaporation substance evaporated from the source means and flying in the vacuum vessel so that the incident angle of the evaporation substance is varied monotonously along the travelling path in the path section or each of the path sections.

It is also preferable that the exposure means is so arranged that the incident density of the reaction gas is varied monotonously along the travelling path in the path section or each of the path sections.

Moreover, the deposition means may constructed by means for introducing the reaction gas into the vacuum vessel so that the incident density of the reaction gas is varied monotonously along the travelling path in the path section or each of the path sections.

BRIEF DESCRIPTION OF THE DRAWINGS

The preferred embodiments of the invention will be now described in great detail with reference to the accompanying drawings wherein:

FIGS. 12 and 13 are graphs as to the second example corresponding to FIGS. 10 and 11 respectively;

DETAILED DESCRIPTION OF THE PREFERRED EMBODIMENTS

Figure 1:
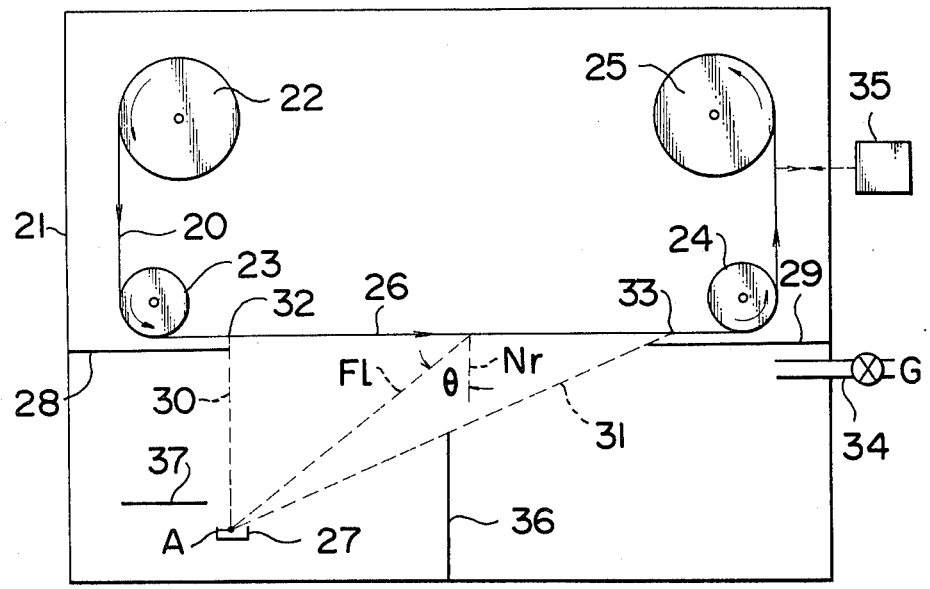
FIG. 1 is a diagrammatic side view of the first embodiment of the vacuum coater adapted to the method and apparatus according to the invention.
Figure 2:
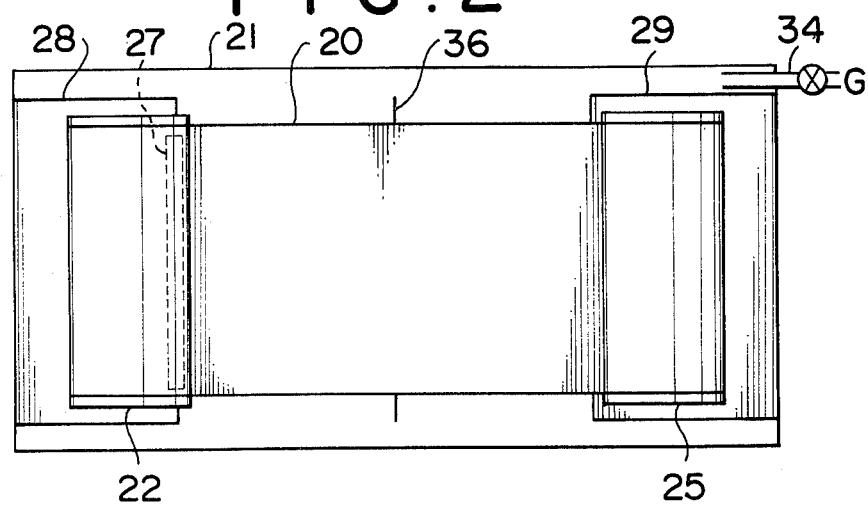
FIG. 2 is a diagrammatic plan showing the coater of FIG. 1.

Referring to FIGS. 1 and 2 of the drawings these figures show a vacuum evaporation apparatus or vacuum coater including a vacuum evaporation vessel 21, in which a long film-shaped substrate 20 is unwound from a substrate roll 22 arranged in a left upper position and deflected by a first deflector roller 23, and then travels along its horizontal travelling path 26. Thereafter the substrate 20 is deflected by a second deflector roller 24 and wound into a product roll 25 arranged in a right upper position. An evaporation source 27 of evaporation substance A for example chromium is positioned at an appropriate distance directly below a point near the left end of the horizontal travelling path 26 of the substrate 20. A first shader plate 28 is so arranged under and near the horizontal travelling path 26 that the first plate 28 prevents the evaporation substance A flying from the evaporation source 27 from reaching the substrate 20 on the left side of the vertical passing through the evaporation source 27. Similarly, a second shader plate 29 is so arranged under and near the horizontal travelling path 26 that the second plate 29 prevents the evaporation substance A from reaching the substrate 20 on the right side of a point near the right end of the horizontal travelling path 26. According to such an arrangement, the evaporation substance A flying between a limit indicated by a vertical broken line 30 and a limit indicated by an oblique broken line 31 arrives onto the under-surface of the substrate 20. Accordingly, the evaporation substance A is deposited on the lower surface of the substrate 20 in a path section between a position 32 in the limit 30 and a position 33 in the limit 31.

Figure 3:
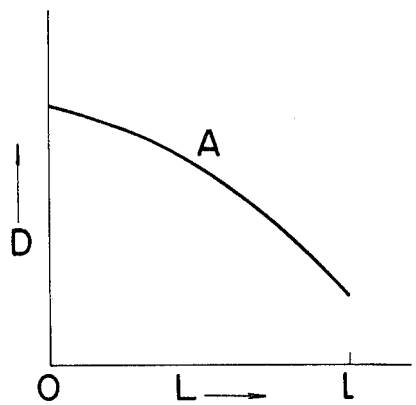
FIG. 3 is a graph showing the relation between the travelling distance and the deposition rate in the coater of FIG. 1.

In this case, it may be clear that the deposition rate D (see FIGS. 3 and 4) of the evaporation substance A on each surface section of the film-shaped substrate 20 decreases monotonously when this surface section travels from the position 32 to the position 33, because the incident angle $\theta$ of the evaporation substance A on the surface section (that is, the angle between the normal Nr of the substrate surface and the flight direction Fl of the evaporation substance A at said surface section) and the flight length $Fl(\theta)$ (that is, the distance between the evaporation source and the surface section) increase monotonously from 0° and Fl(O) in the position 32 to the values in the position 33 respectively. Such a variation of the deposition rate D is shown in FIG. 3 in which the ordinate indicates the deposition rate D and the abscissa the travelling distance L which is assumed to be zero in the position 32 and 1 in the position 33.

Figure 4:
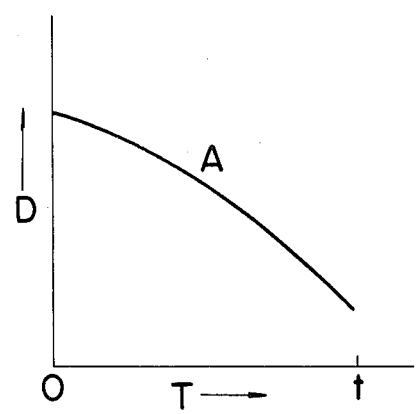
FIG. 4 is a graph showing the relation between the depositing time and the deposition rate in the coater of FIG. 1.

Accordingly, as shown in FIG. 4, the deposition rate D decreases monotonously in regard to the depositing time T which is assumed to be zero at the time when the surface section is positioned in the deposition start position 32 and t at the time when the surface section is positioned in the deposition finish position 33.

Figure 5:
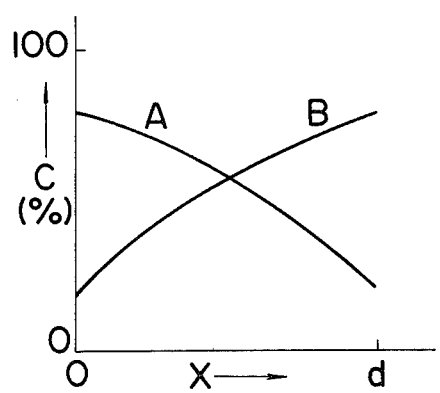
FIG. 5 is a graph showing the distribution of content in the layer obtained in the coater of FIG. 1.
Figure 6:
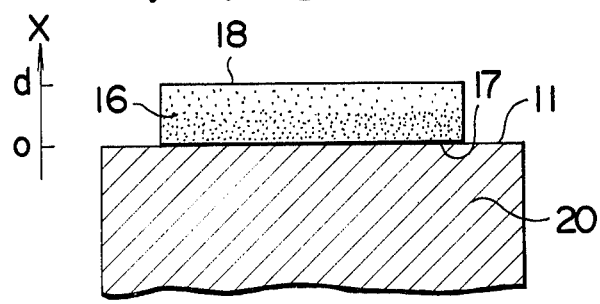
FIG. 6 is an enlarged sectional view of an inhomogeneous optical layer on a substrate.

However, in the vacuum evaporation apparatus or vacuum coater shown in FIGS. 1 and 2, introduced through a gas inlet tube 34 into the vacuum evaporation vessel 21 is reaction gas G which can react on the evaporation substance A to produce reaction product substance B having a lower refractive index than the substance A. For example, if the evaporation substance A is chromium, oxygen is introduced as the reaction gas G which can react on chromium to produce chromium oxide ($Cr_2O_3$). Accordingly, on each surface section of the substrate 20, if the deposition rate D is high then the quantity of the evaporation substance A deposited on this surface section is large as compared with the quantity of the reaction gas G arriving on the surface section, and therefore the quantity of the reaction product substance B is small as compared with that of the substance A remaining without reacted. On the contrary, if the depositing rate D is low then the quantity of the reaction product substance B is large as compared with that of the substance A remaining without reacted. Thus, as shown in FIG. 5 and FIG. 6, in a coating layer 16 formed or produced on each surface section 11 of the substrate 20 through said deposition and reaction, the content C of the evaporation substance A having high refractive index decreases monotonously while the content C of the reaction product substance B having low refractive index increases monotonously from a value at the bottom or inner surface 17 (x=0) of the layer 16 contacting with the surface 11 of substrate 20 to a value at the top or outer surface 18 (x=d) of the layer 16 not facing the substrate. (It is clear that x=0 corresponds to L=0 i.e. the position 32 and x=d corresponds L=1 i.e. the position 33).

In FIGS. 1 and 2, a reference numeral 35 indicates a light emitter/receiver of an optical monitor, 36 an auxiliary shader, and 37 a movable shutter for the evaporation source 27.

Figure 7:
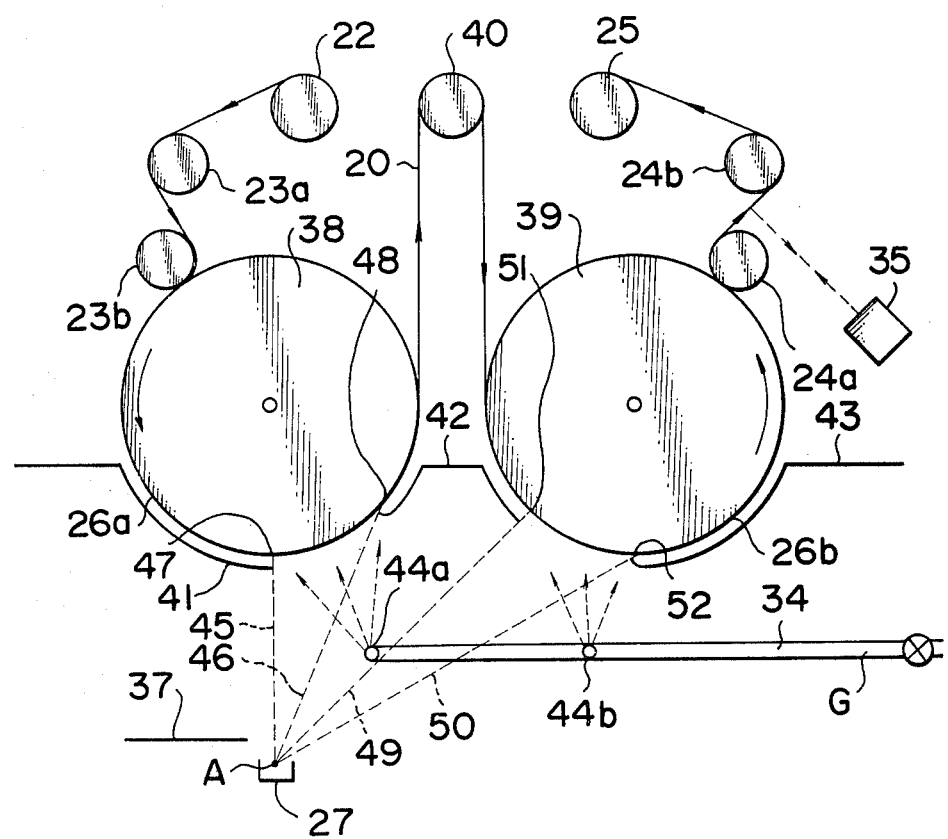
FIG. 7 shows the second embodiment of the coater.

A vacuum coater or vacuum evaporation apparatus illustrated in FIG. 7 has a vacuum evaporation vessel (not shown) in which two parallel cooling drums 38 and 39 are arranged side by side. A film-shaped substrate 20 is unwound from a substrate roll 22 and deflected by several deflector rollers 23a and 23b, and travels along a first arc-shaped travelling path portion 26a while contacting with the lower side of the first cooling drum 38. Thereafter, the substrate 20 is deflected by a deflector roller 40 and travels along a second arc-shaped travelling path portion 26b while contacting with the lower side of the second cooling drum 39. Then the substrate 20 is deflected by several deflector rollers 24a and 24b and wound into a product roll 25. An evaporation source 27 of evaporation substance A is so arranged directly below the horizontal axis of the first cooling drum 38 that this source is remote from the drum 38. By means of shader plates 41, 42 and 43, the evaporation substance A emitted from the evaporation source 27 and flying between a limit 45 and a limit 46 is deposited on the lower surface of the substrate 20 in a path section (47, 48) of the first arc-shaped travelling path portion 26a between positions 47 and 48, and the evaporation substance A flying between limits 49 and 50 is deposited on the lower surface of the substrate 20 in a path section (51, 52) of the second arc-shaped travelling path portion 26b between positions 51 and 52. The limit 45 is a plane being perpendicular to the surface of the first cooling drum 38, and the limit 49 is a plane being perpendicular to the surface of the second cooling drum 39. The limit 46, which is a plane being oblique to the surface of the first cooling drum 38, is so selected that the deposition rate in the position 48 is equal to that in the position 51, and the limit 50 is a plane being oblique to the second cooling drum 39. According to this arrangement, the depositing rate decreases monotonously in the path section (47, 48) of the first arc-shaped travelling path portion 26a from a value in the position 47 to that in the position 48 and then in the path section (51, 52) of second arc-shaped travelling path 26b from a value in the position 51 (this value is equal to that in the position 48) to that in the position 52.

In the apparatus shown in FIG. 7, a gas inlet tube 34 for the reaction gas G extends into the vacuum vessel (not shown in FIG. 7), more particularly extends nearly to a position below both the cooling drums 38, 39, and has one or more ejecting ports 44a, 44b. The shape, size and number of these ejecting ports 44 may be altered variously, and these ports may be a number of holes arranged along the wall of the tube. In each case, the gas inlet tube 34 and ejecting ports 44 are so arranged that the incident density of the flow of reaction gas G (that is, the amount per time of the reaction gas G reaching a position in the travelling path) introduced through the gas inlet tube 34 and ejected from the ejecting ports 44 increases monotonously along the path sections (47, 48), (51, 52) from the value in the position 47 to that in the position 48 and then from the value in the position 51 to that in the position 52. Such an arrangement of the tube 34 and ports 44 can be achieved easily by the person skilled in the art based upon the kinetic theory of gas and the fluid dynamics, and therefore is not minutely explained here. It is clear that such a monotonous increase of the incident density of the reaction gas flow promotes the tendency that, as shown in FIG. 5, the content of the evaporation substance A decreases monotonously while the content of the reaction product substance B increases monotonously according as x increases from zero to d.

Figure 8:
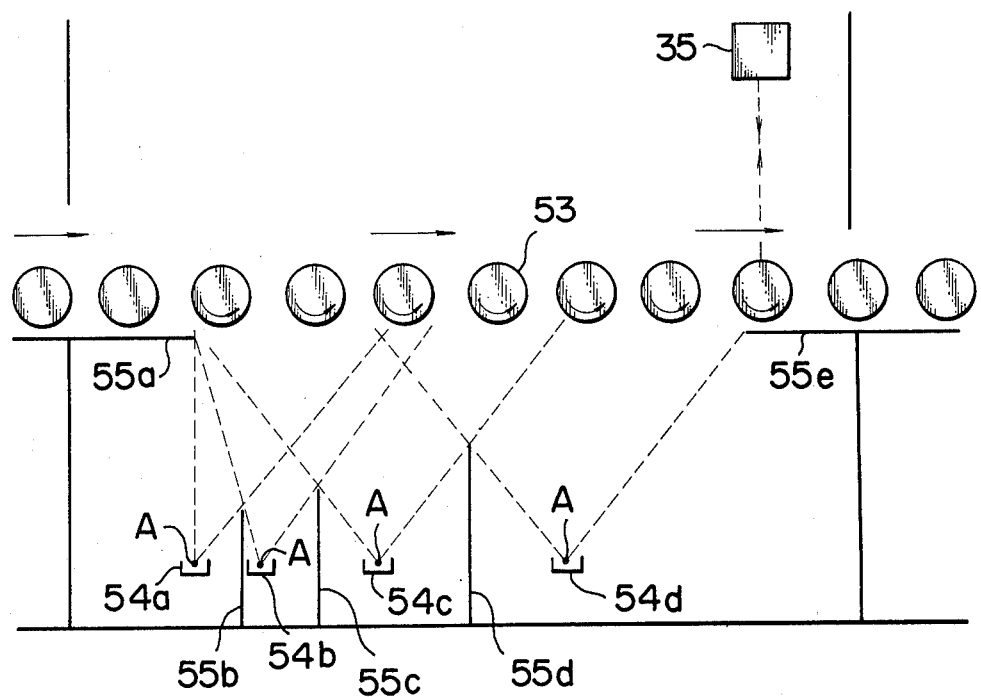
FIG. 8 shows the third embodiment of the coater.

In a vacuum coater as illustrated in FIG. 8, each of cylinder-shaped substrates 53 is moved linearly from the left to the right along a horizontal travelling path while rotating about its own axis. A number of evaporation sources 54a, 54b, 54c and 54d of evaporation substance A are arranged at a same height below the travelling path so that the distance between two sources increases from the left to the right. A number of shader plates 55a, 55b, 55c, 55d and 55e limit the flight direction of the evaporation substance A emitted from each evaporation source. It is clear that the deposition rate decreases monotonously along the travelling path based upon the above arrangement of the evaporation sources. Reaction gas G is introduced in the apparatus of FIG. 8 also, but the explanation as to it is omitted.

Although not illustrated, the deposition rate may be decreased gradually even when the evaporation sources 54a, 54b, 54c and 54d are arranged equidistantly and the input power of each of them are decreased gradually from the left to the right in the same vacuum coater as in FIG. 8.

Figure 9:
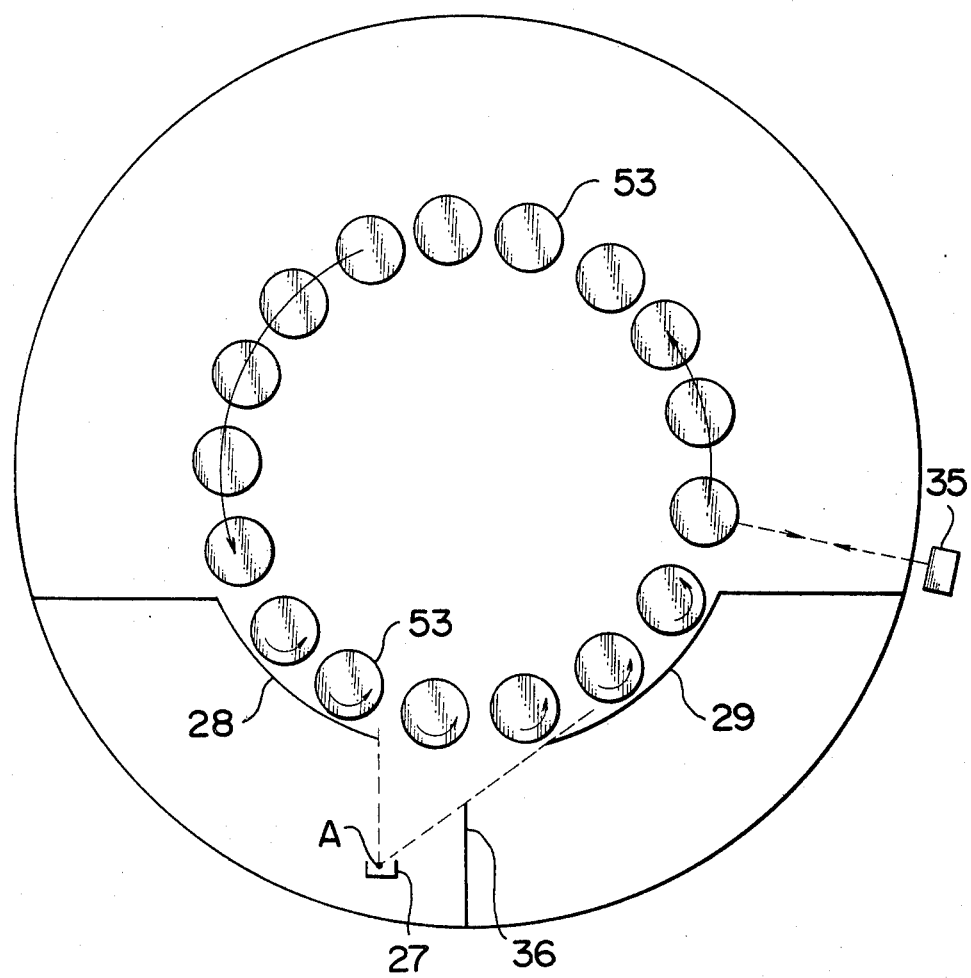
FIG. 9 shows the fourth embodiment of the coater.

In an apparatus of FIG. 9, each of cylinder-shaped substrates 53 is moved along a circular travelling path while rotating about its own axis. An evaporation source 27 and shader plates 28, 29 and 36 are arranged as shown in FIG. 9. Reaction gas G is introduced in this apparatus of FIG. 9 also.

According to the invention, an imhomogeneous layer may be formed on a surface of a long, wide or large substrate easily on a large scale by means of simple means such as shader plates and a gas inlet tube without changing the deposition rate with time, as clarified in the above explanation described in connection with various vacuum evaporation apparatuses or vacuum coaters.

The substrate may be shaped as film, foil, plate, cylinder or the like, and may be made of aluminium, copper, stainless steel, nickel, aluminium coated with nickel, glass, semiconductor, plastics and so on. The evaporation substance A, reaction gas G and reaction product substance B are, for example, as follows:

| A | G | B |
| --- | --- | --- |
| Cr | $O_2$ | $Cr_2O_3$ |
| SiO | $O_2$ | $SiO_2$ |
| Cu | $O_2$ | CuO |

In the several embodiments stated above, the deposition rate decrease in the travelling direction along the travelling path, the incident density of the reaction gas flow increases in the travelling direction along the travelling path if necessary, and the reaction of the reaction gas on the evaporation substance produces a reaction product substance having a lower refractive index than that of the evaporation substance. However, it is, of course, possible to cause the evaporation rate to increase in the travelling direction, the incident density to decrease, in the travelling direction and/or the reaction to produce a reaction product substance of higher refractive index.

In three examples of the method of the invention explained below, the vacuum coater as shown in FIG. 7 was utilized, in which Cr was used as the evaporation substance A for forming a selective absorption layer of Cr-$Cr_2O_3$ on a glossy surface (nearly, mirror surface) of a substrate 20 of aluminium foil. The refractive index of the surface of the formed layer was watched by means of the optical monitor 35 to control the thickness of the layer. In these three examples, the diameters of the first cooling drum 38 and second cooling drum 39 were 40 cm, the distance between the axes of the cooling drums 38 and 39 was 52 cm, the distances between the evaporation source 27 and the positions 47, 48, 51, 52 were 35 cm, 45 cm, 58 cm, 65 cm respectively, and the incident angles (the angle between the normal plane of the cooling drum 38 or 39 and the incident direction of the evaporation substance) in the positions 47, 48, 51 and 52 were 0, 70, 0 and 60 degrees respectively.

Figure 10:
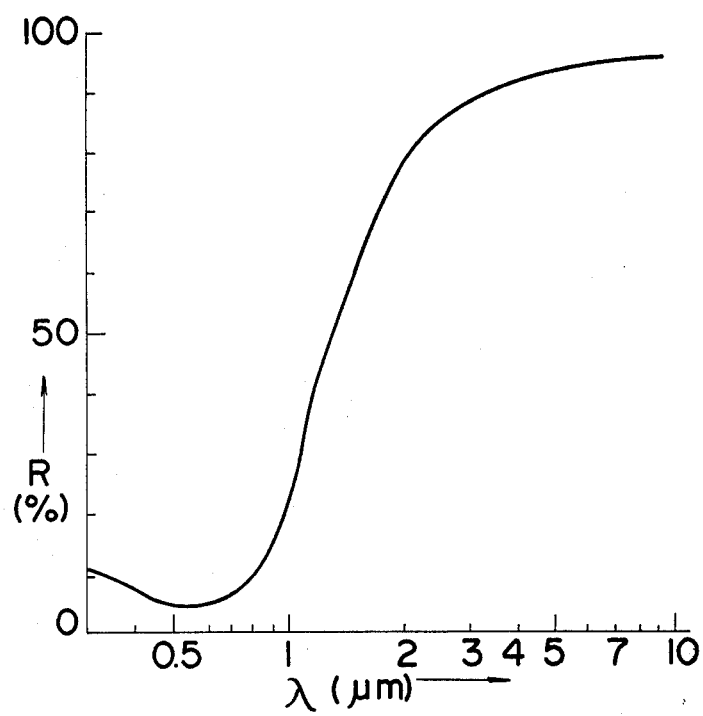
FIG. 10 shows the reflectivity of a layer obtained by the first example of the method according to the invention.
Figure 11:
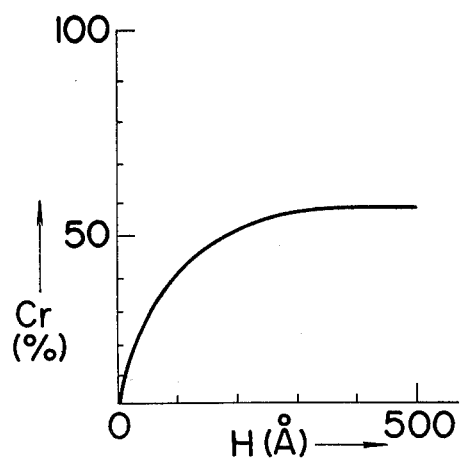
FIG. 11 shows the distribution of content in the layer obtained by the first example.

In the first example, the substrate was an aluminium foil having a thickness of 50 μm, a breadth of 75 mm and a length of 150 m, the pressure in the vacuum evaporation vessel was $4 \times 10^{-5} - 1 \times 10^{-4}$ Torr, and the travelling speed of the aluminium foil was 0.4 m/min. Air including oxygen was introduced as the reaction gas so as to spread nearly uniformly throughout the travelling path, and a coating layer having a thickness of about 500 Å was formed on the surface of the aluminium foil. The reflectivity of the formed layer was as shown in FIG. 10, and the distribution of component was as shown in FIG. 11. In FIG. 10, the abscissa indicates the wave length λ in μm and the ordinate indicates the reflectivity R in %, and in FIG. 11, the abscissa indicates the depth H from the outer surface of the coating layer in Å and the ordinate indicates volume percentage of Cr measured by Auger electron analysis (AES).

Figure 14:
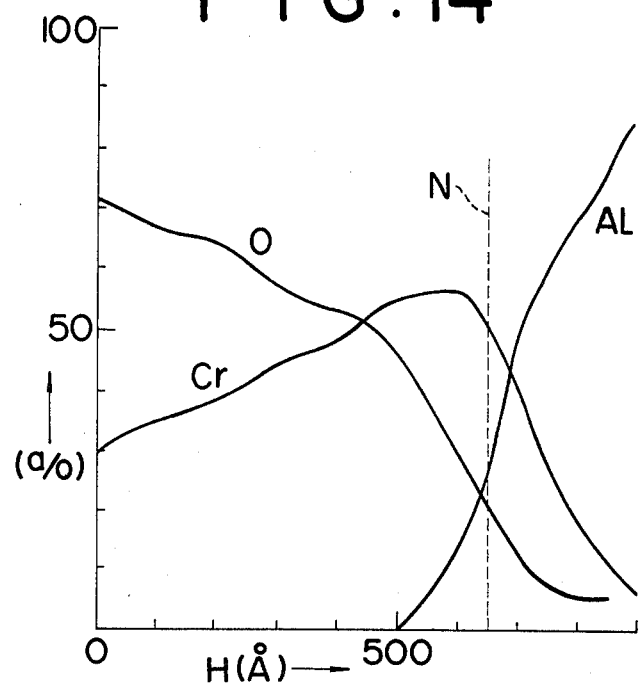
FIG. 14 shows the result of the surface analysis (by Auger electron spectroscopy i.e. AES) of the layer obtained by the second example.

In the second example, the size of the aluminium foil was 50 μm in thickness, 75 mm in breadth and 150 m in length, the pressure in the vacuum vessel was $1 \times 10^{-4}$ Torr, and the travelling speed measured 1 m/min. Oxygen itself was introduced as the reaction gas at the flow rate of about 60 cc per minute at the atmospheric pressure so as to spread nearly uniformly throughout the travelling path, and a coating layer having a thickness of 700 Å was formed. The reflectivity was as shown in FIG. 12 corresponding to FIG. 10 and the distribution of component in the layer was as shown in FIG. 13 corresponding to FIG. 11. Moreover, the result of AES at each depth H was shown in FIG. 14 in which the ordinate indicates atomic percentages of Cr, O and Al and the broken line N shows the substantial interface between the layer and substrate.

In the third example, the dimensions of the aluminium foil were 40 μm in thickness, 75 mm in breadth and 200 m in length, the pressure in the vacuum vessel measured about $4 \times 10^{-5}$ Torr, and the travelling speed was 1 m per minute. In order to introduce the reaction gas (oxygen), the gas inlet tube 34 with an inner diameter of 8 mm, an outer diameter of 10 mm and a length of 120 mm was so positioned in a horizontal plane that it is perpendicular to the travelling direction of the aluminium foil and apart from the first cooling dram 38 and the second cooling drum 39 by 10 cm and 7 cm respectively.

Figure 15:
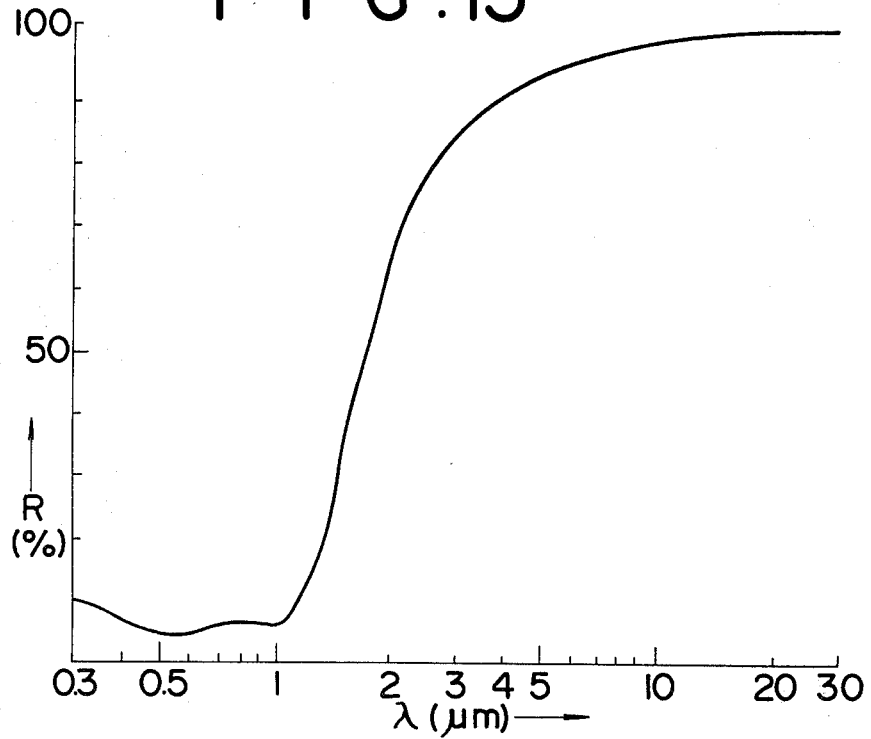
FIG. 15 is a graph as to the third example corresponding to FIG. 10.
Figure 16:
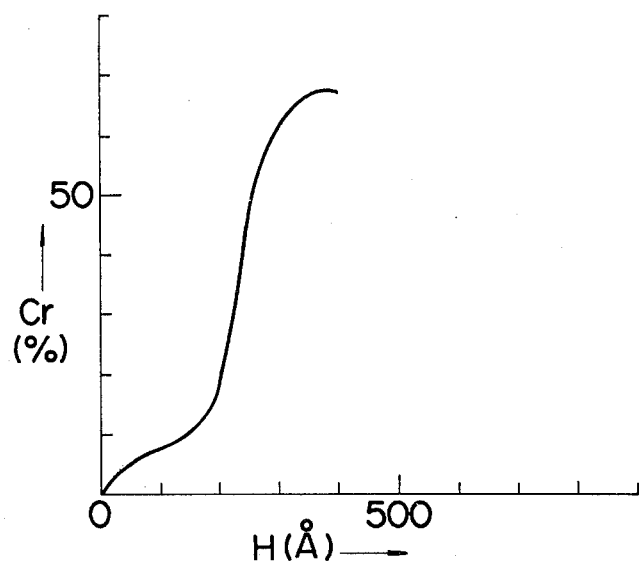
FIG. 16 is a graph as to the third example corresponding to FIG. 11.
Figure 17:
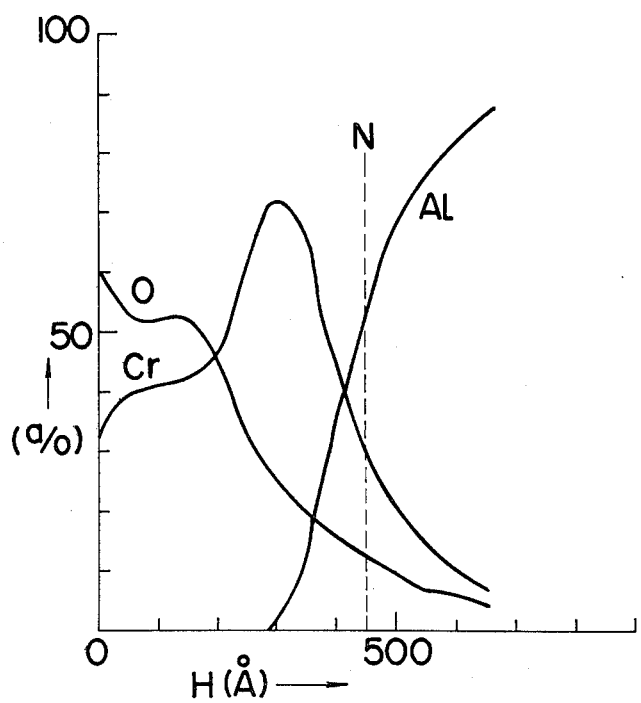
FIG. 17 is a graph as to the third example corresponding to FIG. 14.

In each of several tube cross-sections which are apart from each other by 20 mm, three holes having a diameter of 2 mm were formed in the wall of the tube so that the middle one of them is directed nearly upwards. And these holes were used as ejecting ports for ejecting oxygen toward the travelling path. The reflectivity was as shown in FIG. 15 corresponding to FIG. 10. The distribution of component in the layer was as shown in FIG. 16 corresponding to FIG. 11, and the results of AES at each depth H was as shown in FIG. 17 corresponding to FIG. 14.

We claim:

1. An apparatus for forming an inhomogeneous optical layer on a surface of a substrate comprising a vacuum vessel, means for moving the substrate along a travelling path in the vacuum vessel, said travelling path having a path section or a number of path sections, source means for evaporating an evaporation substance in the vacuum vessel, deposition rate regulating means for causing the evaporation substance evaporated from the source means to be deposited on the surface of the substrate moving along the travelling path with the depositing rate being varied monotonously along the travelling path in the path section or each of the path sections, and exposure means for causing the deposited evaporation substance to be exposed to reaction gas which is able to react on the evaporation substance.

2. An apparatus according to claim 1 wherein the deposition rate regulating means is constructed by shader means which shades the evaporation substance evaporated from the source means and flying in the vacuum vessel so that the incident angle of the evaporation substance is varied monotonously along the travelling path in the path section or each of the path sections.

3. An apparatus according to claim 1 or 2 wherein the exposure means is so arranged that the incident density of the reaction gas is varied monotonously along the travelling path in the path section or each of the path sections.

4. An apparatus according to claim 3 the depositing means is constructed by means for introducing the reaction gas into the vacuum vessel so that the incident density of the reaction gas is varied monotonously along the travelling path in the path section or each of the path sections.

* * * * *